(12) United States Patent
Box

(10) Patent No.: US 9,374,917 B2
(45) Date of Patent: Jun. 21, 2016

(54) METHOD FOR PLACING AN ELECTRONIC PRINTED CARD IN CONTACT WITH A PLURALITY OF CONTACT ELEMENTS IN A HOUSING RECEIVING OR SURROUNDING THE ELECTRONIC PRINTED CARD AND HOUSING

(71) Applicant: Visteon Global Technologies, Inc., Van Buren Township, MI (US)

(72) Inventor: Benoit Box, L'Isle Adam (FR)

(73) Assignee: Visteon Global Technologies, Inc., Van Buren Township, MI (US)

( * ) Notice: Subject to any disclaimer, the term of this patent is extended or adjusted under 35 U.S.C. 154(b) by 0 days.

(21) Appl. No.: 14/360,569

(22) PCT Filed: Oct. 31, 2012

(86) PCT No.: PCT/EP2012/071635
§ 371 (c)(1),
(2) Date: May 23, 2014

(87) PCT Pub. No.: WO2013/075919
PCT Pub. Date: May 30, 2013

(65) Prior Publication Data
US 2014/0321082 A1     Oct. 30, 2014

(30) Foreign Application Priority Data

Nov. 26, 2011  (DE) .......................... 10 2011 119 576
Apr. 26, 2012  (FR) ...................................... 12 01226

(51) Int. Cl.
*H05K 5/00*     (2006.01)
*H01R 12/72*    (2011.01)
*H01R 13/08*    (2006.01)

(52) U.S. Cl.
CPC ............ *H05K 5/0069* (2013.01); *H01R 12/721* (2013.01); *H01R 13/08* (2013.01); *Y10T 29/49117* (2015.01)

(58) Field of Classification Search
USPC .......................... 361/753, 721, 748, 760, 761
See application file for complete search history.

(56) References Cited

U.S. PATENT DOCUMENTS

| 5,904,581 | A | 5/1999 | Pope et al. |
| 5,910,025 | A | 6/1999 | Mendolia |
| 6,293,833 | B1 * | 9/2001 | Kamath ........................ 439/851 |

FOREIGN PATENT DOCUMENTS

| DE | 43 24 917 A1 | 2/1994 |
| DE | 10 2000 025 977 A1 | 12/2007 |

(Continued)

OTHER PUBLICATIONS

International Search Report for application No. PCT/EP2012/071635 mailed Feb. 7, 2013.

(Continued)

*Primary Examiner* — Hung S Bui
(74) *Attorney, Agent, or Firm* — Fletcher Yoder, P.C.

(57) ABSTRACT

A method for placing an electronic printed card in contact with contact elements in a housing receiving or surrounding card. The card is received in the housing and has a plurality of contact recesses. The contact elements have a first end on the outer side of the housing and a second end on the inner side of the housing, and each comprises, at the second end, a flexible extension capable of being positioned in a first rest position and a second contact position. In a first step the electronic printed card is positioned relative to the housing such that the two ends of the contact elements are located facing the contact recesses, the flexible extensions being positioned in their first position. Then the card is electrically contacted by the plurality of contact recesses and the flexible extensions of the second end of the contact elements, in their second position.

7 Claims, 4 Drawing Sheets

(56) References Cited

FOREIGN PATENT DOCUMENTS

Figure 1:
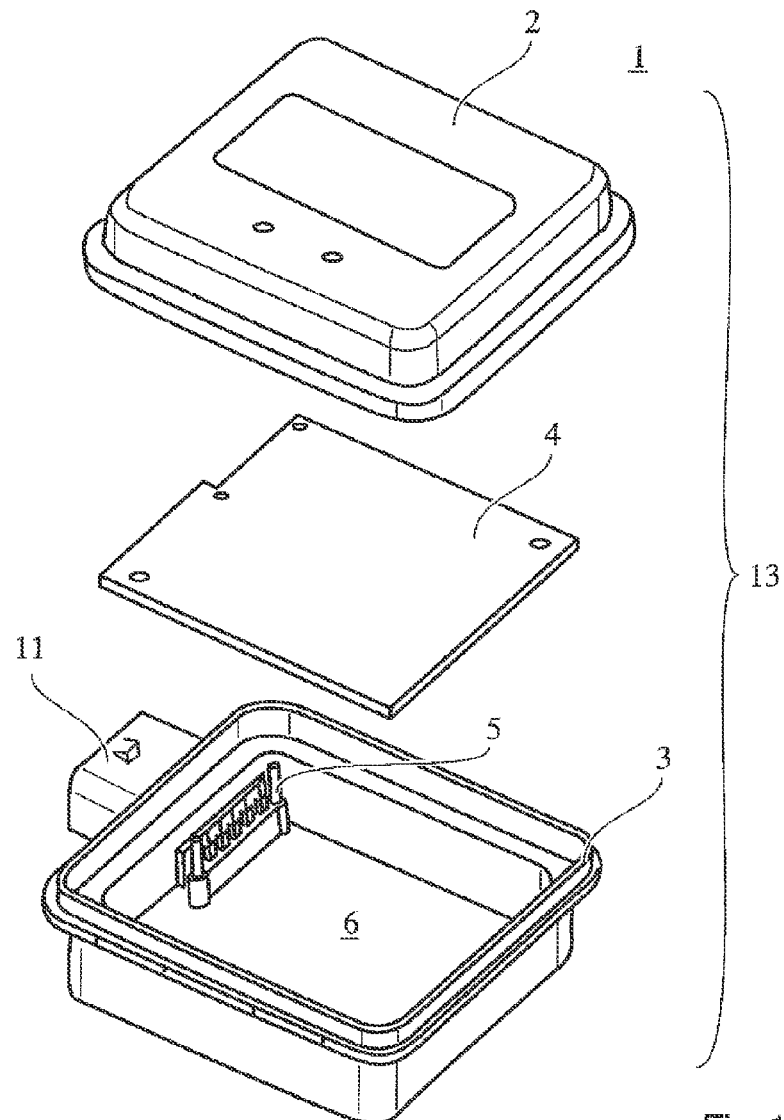

| | | | |
|---|---|---|---|
| JP | 4 277474 | A | 10/1992 |
| JP | 2000 294323 | A | 10/2000 |

OTHER PUBLICATIONS

International Preliminary Report of PCT/EP2012/071635 dated May 27, 2014; 6 pgs.

\* cited by examiner

METHOD FOR PLACING AN ELECTRONIC PRINTED CARD IN CONTACT WITH A PLURALITY OF CONTACT ELEMENTS IN A HOUSING RECEIVING OR SURROUNDING THE ELECTRONIC PRINTED CARD AND HOUSING

CROSS REFERENCE TO RELATED APPLICATIONS

This application claims priority from and the benefit of PCT Application No. PCT/EP2012/071635, filed on Oct. 31, 2012; German Patent No. DE 10 2011 119 576.2, filed on Nov. 26, 2011; and French Patent FR 12/01226, filed on Apr. 26, 2012; all entitled "Method for Placing an Electronic Circuit Board in Contact with a Plurality of Contact Elements in a Housing Receiving or Surrounding the Electronic Circuit Board and Housing", which are herein incorporated by reference.

BACKGROUND

The invention relates to a method for placing an electronic circuit board in contact with a plurality of contact elements in a housing receiving or surrounding the electronic circuit board, and to a housing and to contacts formed as a result.

In the prior art the contacts are arranged in the respective housing, preferably in the region of a plug-in connection, such that a first end of the contacts protrudes outwardly, whereas a second end protrudes into an inner space of the housing. In this case, the contacts are overmolded in their central region, preferably with the material of the housing. The inner-side end of each contact is also formed in a manner corresponding to the receiving portions in an electronic circuit board, the electronic circuit board being fitted on the contacts and being connected, for example welded, preferably by integral bonding.

SUMMARY

The object of the present invention is to propose a method, which is improved compared with the prior art, for placing an electronic circuit board in contact with contacts in a housing receiving or surrounding the electronic circuit board, and contacts formed as a result.

The object is achieved in accordance with the invention with a method for placing en electronic circuit board in contact with a plurality of contact elements in a housing receiving or surrounding the electronic circuit board, the electronic circuit board being received in the housing, the electronic circuit board comprising a plurality of contact recesses, the contact elements comprising a first end on the outer side of the housing and a second end on the inner side of the housing, each of the contact elements comprising, at the location of its second end, at least one flexible extension capable of being positioned in a first rest position and a second contact position, the method comprising:
  a first step, during which the electronic circuit board is positioned relative to the housing in such a way that the second ends of the contact elements are located facing the contact recesses, the flexible extensions being positioned in their first position, and
  a second step, during which the electronic circuit board is electrically contacted by means of, on the one hand, the plurality of contact recesses and, on the other hand, the flexible extensions of the second end of the contact elements, the flexible extensions being positioned in their second position.

The object is also achieved in accordance with the invention with contacts for contacting an electronic circuit board in a housing receiving or surrounding the electronic circuit board, said board being received and overmolded in a conventional manner in the housing, by forming a plug portion arranged on the outer side of the housing, the inner-side end of the contacts having at least one, preferably two, wing-shaped extension(s), which is/are flexible, at least in some regions.

Recesses (contact recesses) are arranged on the electronic circuit board on the front side and are formed in a manner corresponding to the inner-side ends of respective contact elements, in particular in a manner corresponding to the wing-shaped extensions. In this case, the recesses have an electrically conductive, preferably metal, surface, which allows the circuit board to be placed in contact with the wing-shaped extensions of the contacts.

In the method for placing an electronic circuit board in contact with contacts in a housing receiving or surrounding the electronic circuit board, the electronic circuit board is inserted or pushed into the housing in such a way that the inner-side end of the contacts is arranged with the wing-shaped extensions in the respective recess in the circuit board. In this case, the flexible wing-shaped extensions are deformed, create a resistance against this deformation, and thus apply a bearing force on the recesses in the circuit board.

Reliable electrical contact is thus made possible between the contact and the recess on the electronic circuit board, such an electrical contact being particularly resistant to vibrations, for example in contrast with a conventional welded assembly.

A simple arrangement of the electronic circuit board in the housing can thus be obtained, in which in particular a mechanical influencing of the circuit board during the assembly in the housing is significantly reduced.

In particular, damage to the contact and/or to the circuit board is thus avoided during the assembly process. A risk of interruption of the electrical contact between the contact and the circuit board is also reduced by the reduced mechanical influencing.

A preferred development of the invention lies in the fact that the flexible extensions are at least partly bent in their second position.

As a result of such an embodiment of a display device, it is advantageously possible for a spring force, caused by the bending of the flexible extensions, to be produced, which ensures the contact between the electronic circuit board and the contact elements.

A particularly preferred development of the invention lies in the fact that the flexible extensions are, in their second position,
  bent resiliently or
  bent partly resiliently and partly plastically.

As a result of such an embodiment of a display device, it is advantageously possible that, if the flexible extensions are resiliently bent, the electrically conductive contact can be interrupted (that is to say the electronic circuit board can be released from the housing), or, if the flexible extensions are bent partly resiliently and partly plastically, the electrically conductive contact can be produced with a maximum spring force of the flexible extensions.

The present invention also relates to a housing with contact elements for contacting an electronic circuit board, the housing receiving or surrounding an electronic circuit board, the electronic circuit board comprising a plurality of contact recesses, the contact elements comprising a first end on the outer side of the housing and a second end on the inner side of the housing, each of the contact elements comprising, at the location of its second end, at least one flexible extension capable of being positioned in a first rest position and a second contact position, the electronic circuit board being electrically contacted by means of, on the one hand, the plurality of contact recesses and, on the other hand, the flexible extensions of the second end of the contact elements, the flexible extensions being positioned in their second position.

A particularly preferred development of the invention lies in the fact that the flexible extensions are at least partly bent in their second position.

Yet a further particularly preferred development of the housing according to the present invention lies in the fact that the flexible extensions are, in their second position, bent resiliently or bent partly resiliently and partly plastically.

A particularly preferred development of the invention lies in the fact that the housing comprises a plug element arranged on the outer side of the housing.

A further preferred development of the invention lies in the fact that the flexible extensions are provided in the form of wings.

Yet a further particularly preferred development of the invention lies in the fact that each contact element comprises, at the location of its second end, two flexible wing-shaped extensions.

Further features and advantages of the invention will become clearer upon reading the following description of a specific non-limiting embodiment of the present invention.

DRAWINGS

Figure 2:
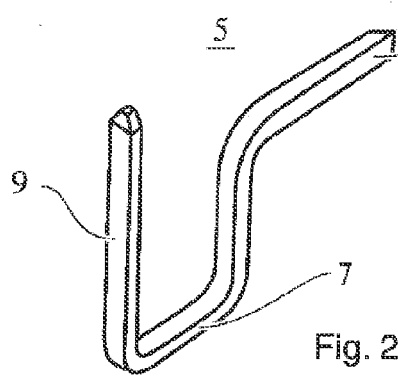
Figure 3:
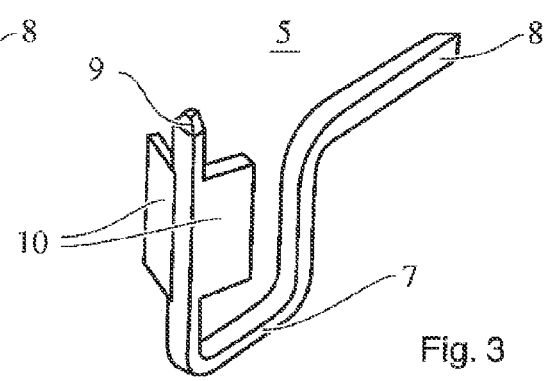
Figure 4:
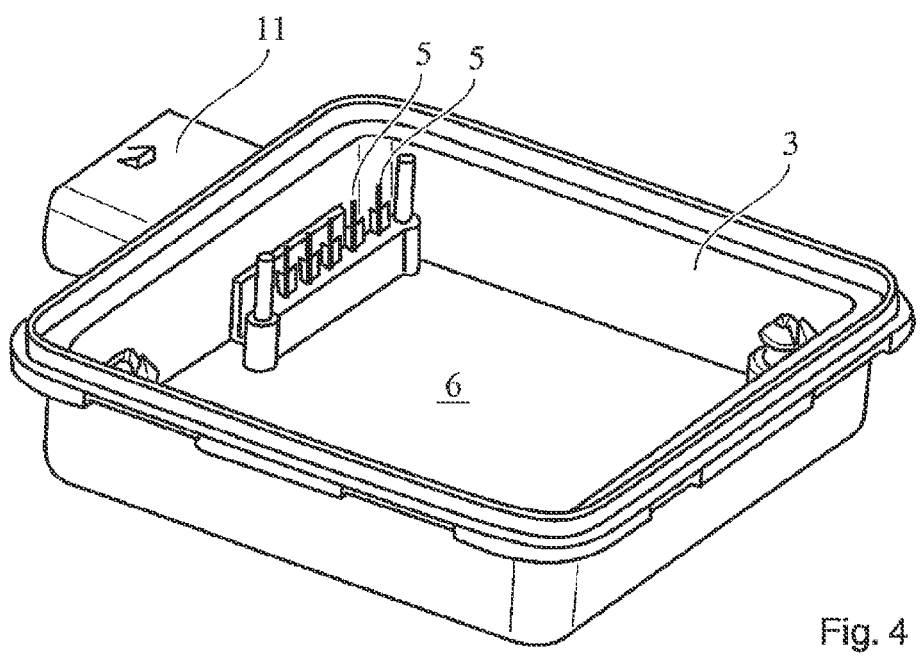
Figure 5:
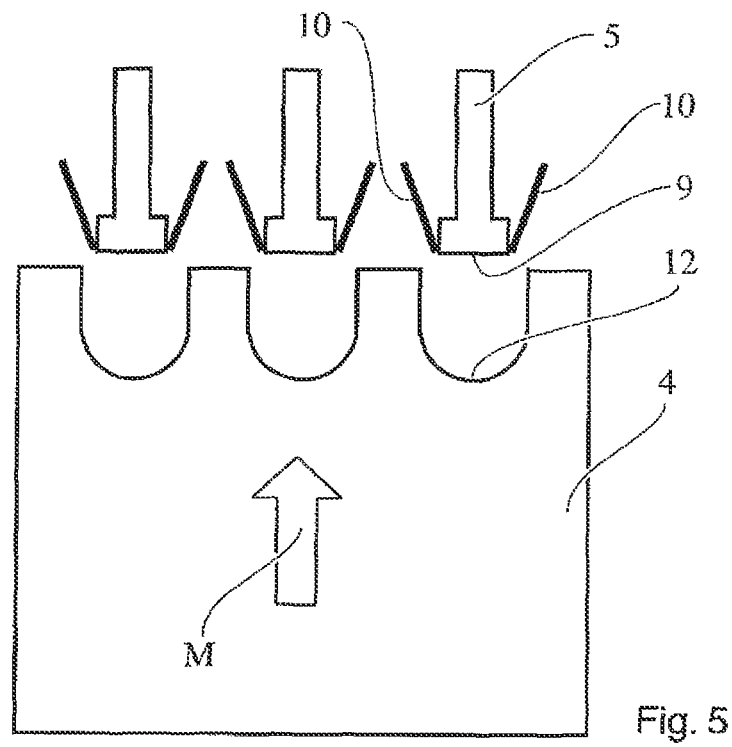
Figure 6:
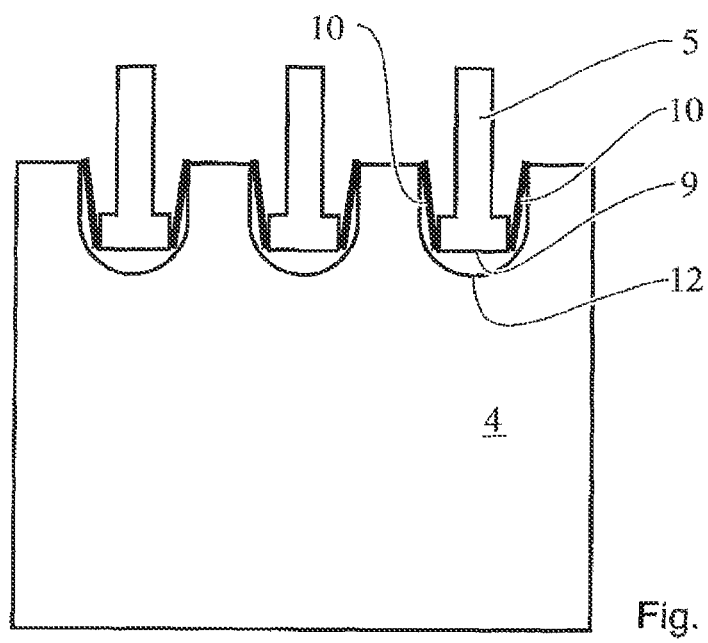
Figure 7:
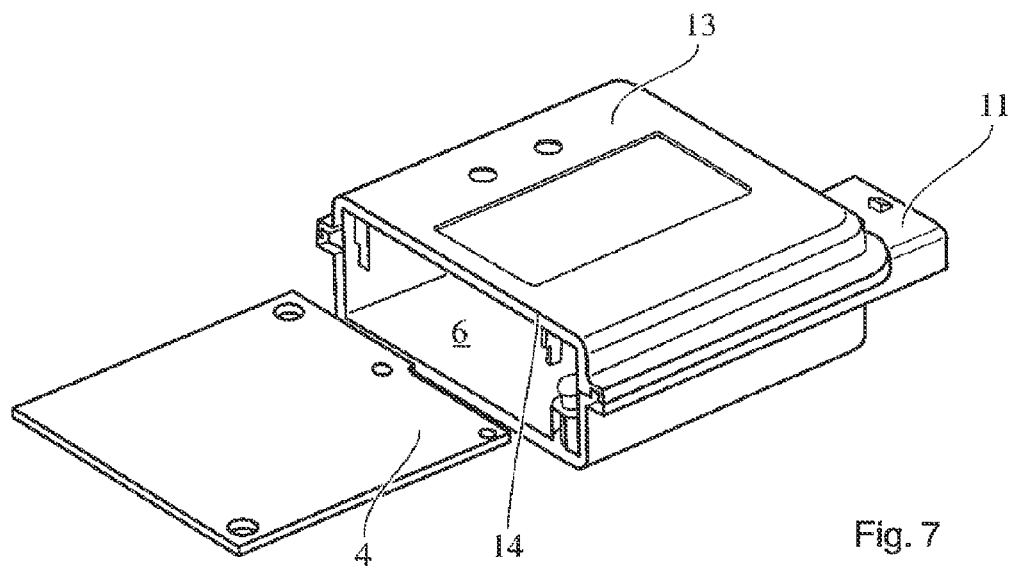
Figure 8:
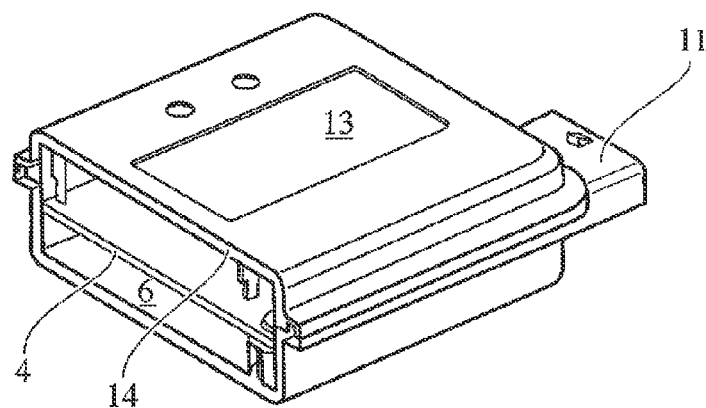

The invention will be better understood thanks to the following description, which refers to preferred embodiments, given by way of non-limiting example and explained with reference to the accompanying schematic drawing, in which:

FIG. 1 schematically shows an exploded view of an electronic control unit according to the prior art, FIG. 2 schematically shows a perspective view of a contact according to the prior art, FIG. 3 schematically shoes a perspective view of a contact according to the invention with wing-shaped extensions, FIG. 4 schematically shows a perspective view of a lower housing half with contacts according to the invention, FIG. 5 schematically shows a plan view of a process for placing a plurality of contacts in contact with a circuit board, FIG. 6 schematically shows a plan view of a process for placing a plurality of contacts in contact with a circuit board, FIG. 7 schematically shows a perspective view of a housing with a receiving opening on the front side for the circuit board, and FIG. 8 schematically shows a perspective view of a housing with a receiving opening on the front side for the circuit board and a circuit board arranged in the housing.

DETAILED DESCRIPTION

Exemplary embodiments of the invention are explained in greater detail below with the aid of the drawings.

In all the drawings, corresponding parts are denoted by like reference signs.

FIG. 1 schematically shows an exploded view of an electronic control unit 1 according to the prior art. Such an electronic control unit 1 is configured, for example, in the form of an engine control unit and/or gearbox control unit and comprises a housing 13, which is formed half by an upper housing 2 and half by a lower housing 3, and an electronic circuit board 4. The housing 13 is divided here in the horizontal direction into the housing halves 2, 3.

At least one conventional plug-in connection 11 is formed on and/or in one of the housing halves 2, 3 and comprises a plurality of contacts 5 (also referred to as contact elements 5), which are arranged side by side, preferably in at least one row. In this case, the contacts 5 are arranged in one of the housing halves 2, 3, in such a way that a first end 8 of the contacts 5 protrudes outwardly, whereas a second end 9 protrudes into an inner space 6 of the housing 13.

FIG. 2 schematically shows a perspective view of such a contact 5 according to the prior art.

So as to allow a reliable mechanical and fluidproof arrangement of the contacts 5 in at least one of the housing halves 2, 3, the contacts 5 are overmolded in their central region 7, preferably with the material of the housing. The inner-side end 9 of each of the contacts 5 is also formed in a manner corresponding to receiving portions in the electronic circuit board 4, the electronic circuit board 4 being fitted on the contacts 5 and being connected, for example welded, preferably by integral bonding.

The housing halves 2, 3 are preferably formed on the basis of a thermoplastic polymer material and are interconnected by integral bonding once the circuit board 4 has been placed in position on the contacts 5 by means of a conventional process, in particular a welding process. Such a welding is achieved particularly preferably with a vibration welding process.

FIG. 3 schematically shows a perspective view of a contact 5 according to the invention with wing-shaped extensions 10. In accordance with the invention, the inner-side end 9 of the contacts 5 has at least one, preferably two, wing-shaped extension(s) 10, which are flexible at least in some regions. In this case, the wing-shaped extension 10 are preferably arranged on opposite sides of the contact 5.

The contact 5 is formed on the basis of an electrically conductive, preferably metal, material, the wing-shaped extensions 10 being formed or molded in one piece thereon.

FIG. 4 schematically shows a perspective view of a lower housing half 3 with contacts 5 according to the invention.

FIG. 5 schematically shows a plan view of a procedure for placing a plurality of contacts 5 with wing-shaped extensions 10 in contact with a circuit board 4.

Recesses 12 (also referred to as contact recesses 12) are arranged on the electronic circuit board 4 on the front side and are formed in a manner corresponding to the inner-side ends 9 of respective contacts 5, in particular in a manner corresponding to the wing-shaped extensions 10 thereof. In this case, the recesses 12 are formed for example in a slit-like manner with a rounded end. The recesses 12 have an electrically conductive, preferably metal, surface, which allows the circuit board 4 to be placed in contact with the wing-shaped extensions 10 of the contacts 5.

FIG. 6 schematically shows a plan view of a completed procedure for placing a plurality of contacts 5 in contact with a circuit board 4.

In the method for placing an electronic circuit board 4 in contact with contacts 5 in a housing 13 receiving or surrounding the electronic circuit board 4, the electronic circuit board 4 is inserted or pushed into the housing 13 in the direction of assembly M in such a way that the inner-side end 9 of the contacts 5 is arranged with the wing-shaped extensions 10 in the respective recess 12 in the circuit board 4. In this case, the flexible wing-shaped extensions 10 are deformed, create a resistance against this deformation, and thus apply a bearing force on the recesses 12 in the circuit board 4.

Reliable electrical contact is thus made possible between the contact 5 and the respective recess 12 on the electronic circuit board 4, in particular by the effect of the bearing force, such an electrical contact being particularly resistant to vibrations, for example in contrast with a conventional welded assembly.

FIG. 7 schematically shows a perspective view of a housing 13 with a receiving opening 14 on the front side for the circuit board 4. In contrast with the prior art, the circuit board 4 is pushed from the front side onto the contacts 5 and onto the wing-shaped extensions 10 thereof, such that this procedure can preferably be performed via the receiving opening 14 on the front side of the housing 13. The housing is thus divided vertically, and lateral guide rails can be formed in the housing for the circuit board 4, said rails simplifying the assembly process.

In a variant (not illustrated), the contacts 5 according to the invention can be used with the wing-shaped extensions 10 in a housing divided horizontally in accordance with the prior art.

FIG. 8 schematically shows a perspective view of a housing with a receiving opening on the front side for the circuit board 4, and a circuit board 4 arranged in the housing.

The invention claimed is:

1. A housing comprising:
   a plurality of contact elements configured to contact an electronic circuit board, the housing receiving or surrounding the electronic circuit board, the electronic circuit board comprising a plurality of contact recesses, each contact element of the plurality of contact elements comprising a first end on an outer side of the housing and a second end on an inner side of the housing, wherein each contact element of the plurality of contact elements comprises, at the second end, at least one flexible extension capable of being positioned in a first rest position and in a second contact position, each contact recess of the plurality of contact recesses is electrically contacted by the at least one flexible extension of a respective contact element of the plurality of contact elements, the at least one flexible extension of each respective contact element of the plurality of contact elements being positioned in the second contact position;
   wherein the at least one flexible extension of each respective contact element of the plurality of contact elements is, in the second contact position, bent partly resiliently and partly plastically.

2. The housing as claimed in claim 1, comprising a plug element arranged on the outer side of the housing.

3. The housing as claimed in claim 1, wherein the at least one flexible extension of each contact element of the plurality of contact elements is provided in the form of a wing.

4. The housing as claimed in claim 1, wherein the at least one flexible extension of each contact element of the plurality of contact elements comprises two flexible wing-shaped extensions.

5. A method for placing an electronic circuit board in contact with a plurality of contact elements in a housing receiving or surrounding the electronic circuit board, the electronic circuit board being received in the housing, the electronic circuit board comprising a plurality of contact recesses, each contact element of the plurality of contact elements comprising a first end on an outer side of the housing and a second end on an inner side of the housing, wherein each contact element of the plurality of contact elements comprises, at the second end, at least one flexible extension capable of being positioned in a first rest position and in a second contact position, the method comprising:
   a first step, during which the electronic circuit board is positioned relative to the housing in such a way that the second end of each contact element of the plurality of contact elements is located facing a respective contact recess of the plurality of contact recesses, the at least one flexible extension of each contact element of the plurality of contact elements being positioned in the first rest position, and
   a second step, during which each contact recess of the plurality of contact recesses is electrically contacted by the at least one flexible extension of a respective contact element of the plurality of contact elements, the at least one flexible extension of each respective contact element of the plurality of contact elements being positioned in the second contact position, wherein the at least one flexible extension of each respective contact element of the plurality of contact elements is, in the second contact position, bent partly resiliently and partly plastically.

6. The method of claim 5, wherein the at least one flexible extension of each contact element of the plurality of contact elements is provided in the form of a wing.

7. The method of claim 5, wherein the at least one flexible extension of each contact element of the plurality of contact elements comprises two flexible wing-shaped extensions.

* * * * *